(12) United States Patent
Inoue et al.

(10) Patent No.: US 7,720,127 B2
(45) Date of Patent: May 18, 2010

(54) OPTO-SEMICONDUCTOR DEVICES

(75) Inventors: Yutaka Inoue, Komoro (JP); Kazunori Saitoh, Maruko (JP); Hiroshi Hamada, Komoro (JP); Masato Hagimoto, Komoro (JP); Susumu Sorimachi, Komoro (JP)

(73) Assignee: OpNext Japan, Inc., Kanagawa (JP)

( * ) Notice: Subject to any disclaimer, the term of this patent is extended or adjusted under 35 U.S.C. 154(b) by 0 days.

(21) Appl. No.: 12/232,652

(22) Filed: Sep. 22, 2008

(65) Prior Publication Data

US 2009/0041076 A1 Feb. 12, 2009

Related U.S. Application Data

(63) Continuation of application No. 11/387,986, filed on Mar. 24, 2006, now Pat. No. 7,443,901.

(30) Foreign Application Priority Data

Mar. 29, 2005 (JP) ............................. 2005-095375

(51) Int. Cl.
*H01S 3/097* (2006.01)
(52) U.S. Cl. .................... 372/87; 372/43.01; 372/46.01
(58) Field of Classification Search ................... 372/87, 372/43.01
See application file for complete search history.

(56) References Cited

U.S. PATENT DOCUMENTS

2003/0034485 A1\* 2/2003 Uchida et al. ................... 257/4
2007/0051968 A1\* 3/2007 Yamamoto et al. ............ 257/99

\* cited by examiner

*Primary Examiner*—Dung T Nguyen
(74) *Attorney, Agent, or Firm*—Stites & Harbison PLLC; Juan Carlos A. Marquez, Esq.

(57) ABSTRACT

An opto-semiconductor device. An opto-semiconductor element includes a semiconductor substrate, a multilayered semiconductor layer formed on a first surface of the semiconductor substrate and having a resonator, a first electrode with multiple conductive layers formed on the multilayered semiconductor layer, and a second electrode formed on a second surface of the semiconductor substrate. A support substrate has a first surface formed with a fixing portion having a conductive layer for fixing the first electrode connected thereto through a bonding material. Bonding material and conductive layers forming the first electrode react to form a reaction layer. The difference in thermal expansion coefficient between semiconductor substrate and support substrate is not more than ±50%. A second barrier metal layer not reactive with bonding material is formed inside the first electrode uppermost conductive layer, while uppermost layer reacts with the bonding material to form the reaction layer.

8 Claims, 12 Drawing Sheets

GROW MULTIPLE LAYERS

CVD FOR RIDGE

ETCH GaAs CONTACT LAYER

FORM RIDGE (BY DRY ETCHING)

FORM RIDGE (BY WET ETCHING)

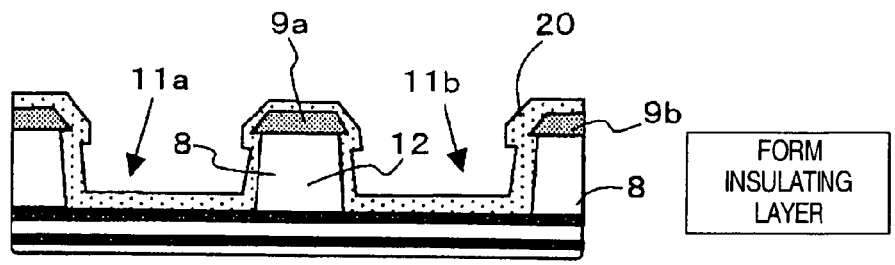
FIG.9A — FORM INSULATING LAYER
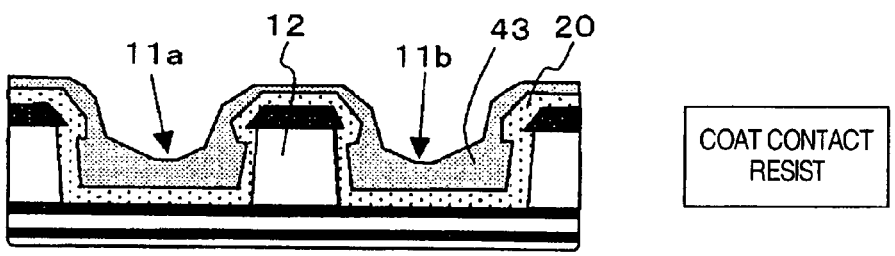
FIG.9B — COAT CONTACT RESIST
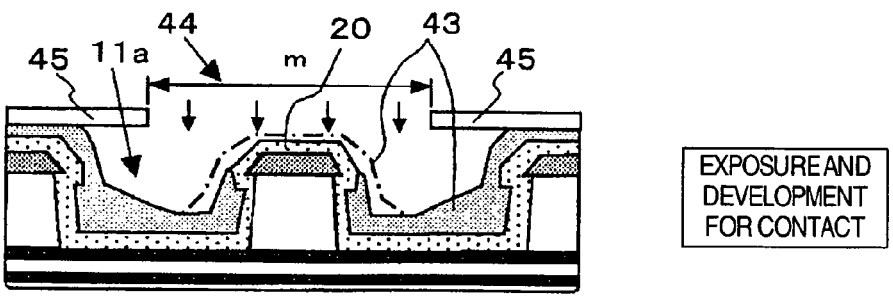
FIG.9C — EXPOSURE AND DEVELOPMENT FOR CONTACT
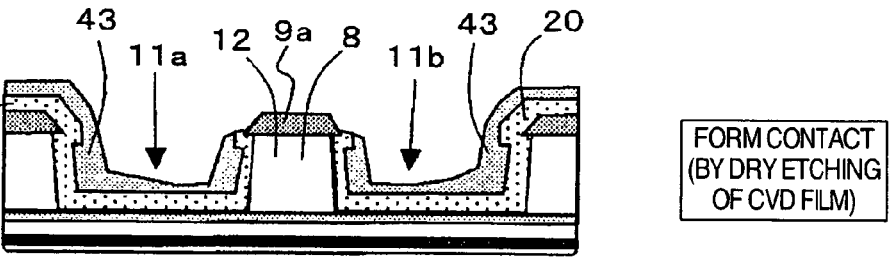
FIG.9D — FORM CONTACT (BY DRY ETCHING OF CVD FILM)
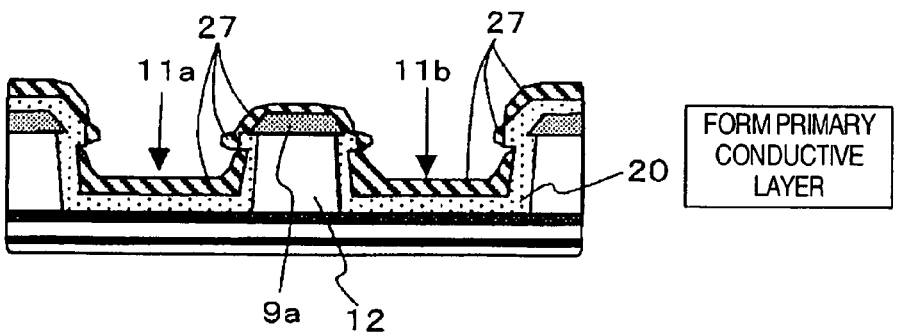
FIG.9E — FORM PRIMARY CONDUCTIVE LAYER FORM Au PLATING

FORM SECONDARY CONDUCTIVE LAYER

POLISH SUBSTRATE

FORM SECOND ELECTRODE

OPTO-SEMICONDUCTOR DEVICES

CROSS-REFERENCE TO RELATED APPLICATION

This application is a Continuation application of U.S. application Ser. No. 11/387,986 filed Mar. 24, 2006 now U.S. Pat. No. 7,443,901. The present application claims priority from U.S. application Ser. No. 11/387,986 filed Mar. 24, 2006, which claims priority from Japanese application 2005-095375 filed on Mar. 29, 2005, the content of which is hereby incorporated by reference into this application.

BACKGROUND OF THE INVENTION

This invention relates to opto-semiconductor devices or in particular to a technique effectively applicable to the fabrication of a laser diode (LD) of a ridge structure.

A semiconductor laser (LD) as an opto-semiconductor element is widely used as a light source of an optical communication system or an information processing system. A visible light semiconductor laser is used as a light source of an information processing system such as a document file system as well as CD, DVD device, laser printer, POS and bar code reader.

The semiconductor laser element (opto-semiconductor element) has such a structure that a multiplicity of semiconductor layers (multiple growth layers) are formed by epitaxial growth on a first surface of a semiconductor substrate. An active layer is formed as a middle layer of the multiple growth layers. One of the layer groups sandwiching the active layer constitutes a semiconductor layer group of a first conduction type and the other layer group constitutes a semiconductor layer group of a second conduction type thereby to form a pn junction. Also, in order to form a resonator (optical waveguide) for laser oscillation, various structures including a thin electrode and a ridge structure are employed. In the semiconductor laser element, a structure is employed in which an anode (positive electrode) and a cathode (negative electrode) are arranged on one surface or separately on obverse and reverse surfaces thereof, respectively.

In the case where the semiconductor laser element (semiconductor laser chip) is fixed on a submount arranged in a package, AuSn or the like solder is used as a fixing means.

SUMMARY OF THE INVENTION

In the high-output semiconductor laser used as a light source of DVD, it is important to improve the polarization characteristic of the laser light. The present inventor, by making analysis, has discovered that in fixing the semiconductor laser element (semiconductor laser chip) on a support substrate called a submount through a bonding material, the uniformity of the layer generated by reaction between the bonding material and the electrode material of the semiconductor laser chip is important. In bonding (fixing) the semiconductor laser chip, heat is applied, so that a junction layer is formed by interaction between the electrode material and the bonding material. This layer is called a reaction layer in this specification.

In fabrication of a semiconductor device, it is common practice to fix a semiconductor chip of silicon on a support plate by scrubbing. According to this scrubbing method, the semiconductor chip is fixedly held with a tool called the collet, and therefore a bonding portion in superior state is obtained. Since the semiconductor chip is scrubbed on the support plate or the like, however, the bonding material under the semiconductor chip is liable to be forced out and swell around the semiconductor chip.

The semiconductor laser element (semiconductor laser chip) is used by being fixed by a bonding material such as AuSn on a support substrate high in heat conductivity (such as AlN) called a submount arranged in the package. Also, in order to efficiently radiate the heat generated by the laser oscillation, the semiconductor laser element is often fixed while the pn junction constituting a heat source is located in proximity to the support substrate (junction down).

In the case where the semiconductor laser chip is fixed on the support substrate by scrubbing, the junction is located at a short distance of about 5 µm from the connection side of the semiconductor laser chip. Therefore, the laser light emitted from the emitting facet (facet) of the semiconductor laser chip impinges on the swollen portion of the bonding material and cannot be emitted further. In fixing the semiconductor laser chip junction down, therefore, the scrubbing method is difficult to employ.

For this reason, the semiconductor laser element (semiconductor laser chip) 80, when fixed on the support substrate (submount) 87 as shown in FIG. 18, is placed through a bonding material 89 on an element fixing portion (chip fixing portion) formed on a first surface of the support substrate 87, while at the same time being heated thereby to fix (bond) the semiconductor laser chip 80 with the bonding material 89. The semiconductor laser chip 80 includes a semiconductor substrate 81 and a multilayered semiconductor portion 82 formed on the first surface of the semiconductor substrate 81. A resonator (optical waveguide) 83 for generating the laser is formed in the middle layer of the multilayered semiconductor portion 82. A first electrode 84 is formed on the multilayered semiconductor portion 82, and a second electrode 85 on a second surface of the semiconductor substrate 81. In junction-down bonding, therefore, the first electrode 84 of the semiconductor laser chip 80 is bonded in superposition on the chip fixing portion 88.

In this bonding method, the semiconductor laser chip 80 is not scrubbed on the support substrate 87, and therefore the bonding material 89 is not swollen out around the chip which otherwise might be caused by scrubbing.

This method, however, consists in heat treating the semiconductor laser chip 80 simply placed on the support substrate 87, and it has been found that the thickness of the reaction layer 90 formed by interaction between the bonding material 89 and the electrode material of the first electrode 84 for the purpose of bonding is liable to be uneven as shown in FIG. 18. It has also been found that the uneven thickness of the reaction layer 90 causes an uneven stress distribution of the multilayered semiconductor portion 82 (resonator 83), thereby affecting the direction of polarization of the laser light. In view of the fact that laser light is used through a polarization plate in the DVD, for example, the effect on the polarization undesirably changes the characteristics of the DVD as a product.

The stress exerted on the semiconductor crystal affects the direction of polarization of the light guided therethrough and causes variations in polarization angle. FIG. 19 is a schematic diagram showing the direction of oscillation of the electric field of the laser light 91. Assume that the horizontal direction along the optical waveguide (resonator) 83 is X direction and the direction perpendicular to the resonator 83 is Y direction. As long as no uneven stress is exerted on the multilayered semiconductor portion 82 formed with the resonator 83, the laser light 91 proceeds toward the two end surfaces (emitting surfaces) of the semiconductor laser chip 80 while oscillating transversely (in X direction) in the resonator 83. In the process, no oscillation component is generated in Y direction.

Once the stress 92 is generated in the multilayered semiconductor portion 82 as shown in FIG. 20, however, the oscillation of the laser light 91 in the resonator 83 generates also the oscillation component in Y direction, and therefore the laser light 91 emitted from the emitting surfaces comes to have a polarization angle α with respect to the X plane.

In order to reduce the change in polarization angle, the stress is required to be uniform in the same plane. In the case where the depth of reaction between the electrode material and the bonding material (solder) for bonding the semiconductor chip is uneven, the distribution of the stress exerted in the optical waveguide (resonator) becomes uneven, and the direction of polarization of the light (laser light) guided along the waveguide becomes irregular, thereby causing variations of the polarization angle.

The variations in the direction of polarization are found to be liable to be caused in the case where a semiconductor laser chip with a GaAs substrate having the coefficient of thermal expansion of $6.5 \times 10^{-6}$/K formed as a semiconductor substrate is bonded on an AlN submount (support substrate) having the coefficient of thermal expansion of 4.6 to $4.7 \times 10^{-6}$/K using AuSn. In the semiconductor laser element having the oscillation wavelength in the band on the order of 0.6 mm, GaAs is used for the semiconductor substrate and the multilayered semiconductor portion formed on one surface of the semiconductor substrate is often made of InP which has the coefficient of thermal expansion of $4.6 \times 10^{-6}$/K approximate to that of GaAs. This phenomenon is more liable to be caused by diamond (C) having the coefficient of thermal expansion of $1.0 \times 10^{-6}$/K due to a large difference in the coefficient of thermal expansion with the semiconductor substrate (GaAs).

The object of this invention is to provide an opto-semiconductor device having a superior polarization characteristic with small variations in the direction of polarization, in which the materials of the support substrate and the semiconductor substrate having a small difference in the coefficient of thermal expansion are combined with each other in the package.

The above and other objects and novel features of this invention will be made apparent from the following description of the specification and the accompanying drawings.

Representative aspects of the invention disclosed in this specification are briefly described below.

According to a first aspect of the invention, there is provided an opto-semiconductor device comprising:

an opto-semiconductor element including a multilayered semiconductor portion formed on a first surface of the semiconductor substrate and formed with a resonator for generating the laser, a first electrode including a multiplicity of conductive layers stacked on the multilayered semiconductor portion, and a second electrode formed on a second surface on the opposite side of the semiconductor substrate far from the first surface; and a support substrate formed, on a first surface thereof, with an element fixing portion having a conductive layer for fixing the first electrode of the opto-semiconductor element;

wherein the first electrode of the opto-semiconductor element is connected to the element fixing portion of the support substrate through a bonding material, and the bonding material and the conductive layers making up the first electrode react with each other to form a reaction layer;

wherein the difference in the coefficient of thermal expansion between the semiconductor substrate and the support substrate bonded to the semiconductor substrate is not more than ±50%; and wherein a second barrier metal layer not reacting with the bonding material is formed on the inside of the uppermost conductive layer of the first electrode, and the uppermost conductive layer reacts with the bonding material thereby to form the reaction layer.

The effects produced by a representative aspect of the invention disclosed herein are briefly described below.

According to the first aspect described above, the second barrier metal layer not reacting with the bonding material is formed on the inside of the uppermost conductive layer of the first electrode, and the reaction layer is formed by the reaction between the uppermost conductive layer and the bonding material. The bonding material fails to react with the second barrier metal layer, and therefore the uppermost conductive layer is the only reaction layer. As a result, a uniform thickness of the reaction layer is secured. Also, as long as the uppermost conductive layer has a uniform thickness, the thickness of the reaction layer is uniform. As described later, the uppermost conductive layer and the second barrier metal layer are formed by vapor deposition, and therefore the thickness variations are so small that the thickness is uniform in the same plane.

In view of the fact that the reaction layer constituting the coupling of the opto-semiconductor element bonded through the bonding material to the support substrate is uniform with no thickness variations, an uneven stress is not exerted on the resonator (optical waveguide), and the direction of polarization of the laser light is varied to a lesser degree. As a result, the polarization characteristic of the opto-semiconductor device is improved.

Other objects, features and advantages of the invention will become apparent from the following description of the embodiments of the invention taken in conjunction with the accompanying drawings.

BRIEF DESCRIPTION OF THE DRAWINGS

FIGS. 9A to 9E are sectional views schematically showing the semiconductor substrate in the process from the step of forming an insulating film to the step of forming a primary conductive layer (wet etching) in the fabrication method of the semiconductor laser element.

DESCRIPTION OF THE EMBODIMENTS

Figure 1:
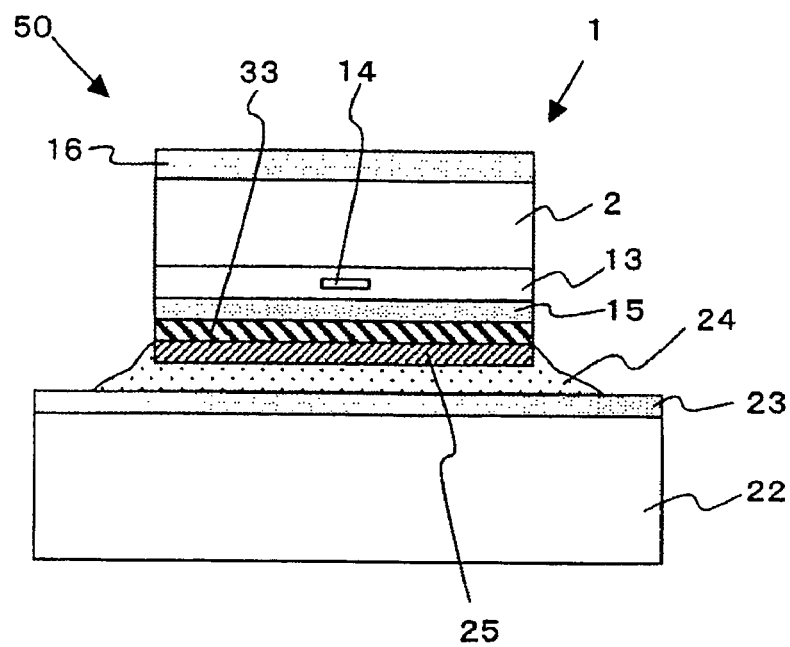
FIG. 1 is a schematic diagram showing a part of an opto-semiconductor device according to a first embodiment of the invention.

Embodiments of the invention are described in detail below with reference to the accompanying drawings. In all the diagrams for explaining the embodiments of the invention, the component parts having the same function are designated by the same reference numeral, and not described repeatedly.

First Embodiment

FIGS. 1 to 12 are diagrams showing an opto-semiconductor device (semiconductor laser device) according to a first embodiment of the invention. The first embodiment represents an application of the invention to the fabrication of a red semiconductor laser in the band on the order of 0.6 μm. The first embodiment also represents an example of the opto-semiconductor device (semiconductor laser device) having built therein a semiconductor laser element of p type (P type) as a second conduction type in the wavelength band on the order of 650 nm. This semiconductor laser element has a structure in which multiple semiconductor layers of AlGaInP, GaInP, GaAs, etc. are formed on a GaAs substrate.

Figure 18:
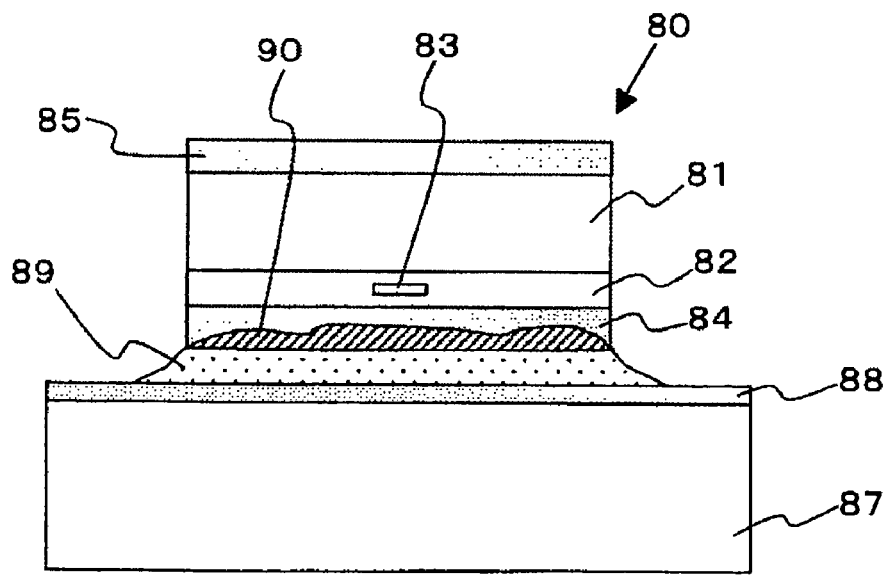
FIG. 18 is a schematic diagram showing a part of the opto-semiconductor device having the conventional structure fixed on an AlN submount with AuSn.
Figure 19:
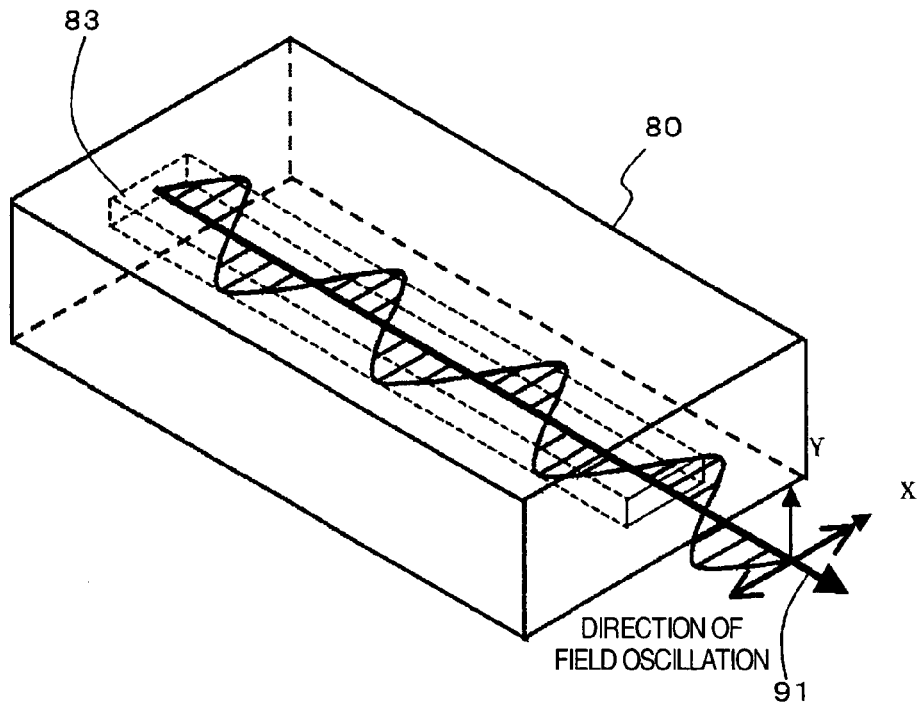
FIG. 19 is a schematic diagram showing the oscillation of the semiconductor laser generated.
Figure 20:
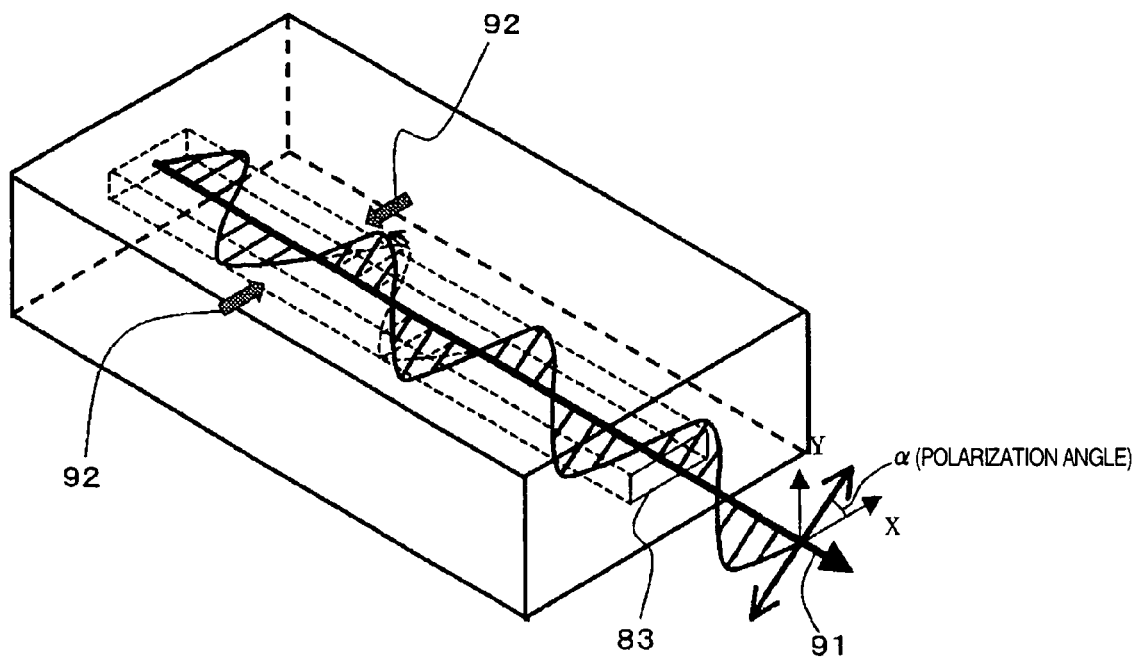
FIG. 20 is a schematic diagram showing the change in polarization angle with stress exerted on the resonator.

Before explaining a specific opto-semiconductor device according to the first embodiment, the features of the invention are explained with reference to the schematic diagram of FIG. 1. FIG. 1 is a diagram corresponding to FIG. 18. FIG. 1 shows the opto-semiconductor element (semiconductor laser element) 1 fixed on a support substrate (submount) 22 arranged in the package of the opto-semiconductor device.

In fixing the opto-semiconductor element (semiconductor laser element) 1 on the support substrate (submount) 22 of AlN, as shown in FIG. 1, the semiconductor laser element (semiconductor laser chip) 1 is placed on an element fixing portion (chip fixing portion) 23 formed on a first surface of the support substrate 22 through a bonding material 24 of AuSn solder, and by being heated, the semiconductor laser chip 1 is fixed (bonded) with the bonding material 24.

The semiconductor laser chip 1 includes a semiconductor substrate 2 of GaAs of first conduction type (n type) and a multilayered semiconductor portion 13 arranged on a first surface of the semiconductor substrate 2. A resonator 14 for generating the laser is formed in the middle layer of the multilayered semiconductor portion 13. A first electrode 15 is formed on the multilayered semiconductor portion 13, and a second electrode 16 on a second surface of the semiconductor substrate 2. In junction-down bonding, therefore, the first electrode 15 of the semiconductor laser chip 1 is bonded on the chip fixing portion 23 in superposed relation therewith.

According to the first embodiment, the first electrode 15 has a structure with a plurality of conductive layers in stack. A second barrier metal layer 33 of Ni is formed on the inside of the uppermost conductive layer of the first electrode 15. The uppermost conductive layer is an Au layer and forms a reaction layer 25 by reaction with the AuSn solder making up the bonding material 24. According to the first embodiment, as described later, the second barrier metal layer 33 and the Au layer constituting the uppermost conductive layer on the second barrier metal layer 33 are both formed by vapor deposition and therefore each have a uniform thickness.

As described above, the heat generated when fixing the semiconductor laser element 1 on the support substrate 22 forms the reaction layer 25 by reaction between the Au layer constituting the uppermost conductive layer and the AuSn solder constituting the bonding material 24. In view of the fact that no reaction occurs between the AuSn solder and the second barrier metal layer 33, however, the reaction layer 25 has a uniform thickness. Therefore, the resonator (optical waveguide) 14 formed in the multilayered semiconductor portion 13 is hardly subjected to stress, which reduces the variations in the direction of polarization of the laser light emitted from the end surface (emitting surface) of the resonator 14.

Figure 2:
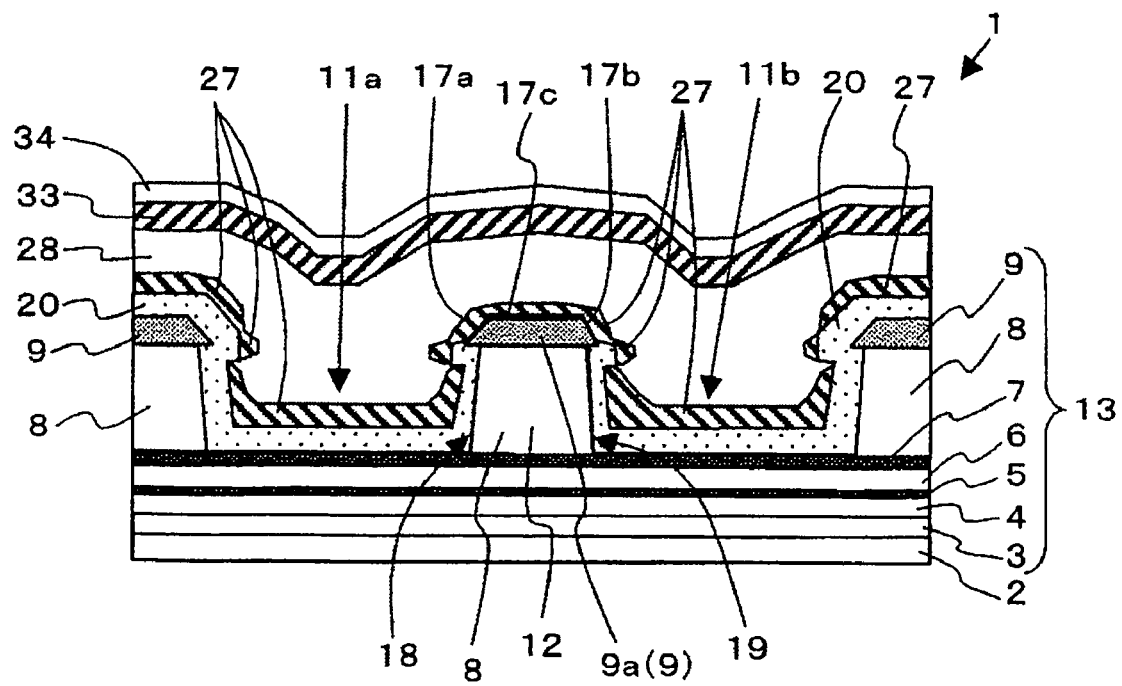
FIG. 2 is a sectional view schematically showing a semiconductor laser element built in the opto-semiconductor device of FIG. 1.

Next, the semiconductor laser element (semiconductor laser chip) 1 is explained. FIG. 2 is a schematic diagram plotted in a manner to facilitate the understanding of the features of the semiconductor laser element 1.

The opto-semiconductor element (semiconductor laser element) 1, as generally shown in FIG. 2, includes a multilayered semiconductor layer (multiple growth layers) 13 composed of a compound semiconductor formed on the first surface of the semiconductor substrate 2. The multiple growth layers include, sequentially formed on the first surface of the semiconductor substrate 2, a n-type buffer layer 3, a n-type clad layer (first clad layer) 4, an active layer 5, a p-type clad layer (first second clad layer) 6, a p-type etch stop layer 7, a p-type clad layer (second second clad layer) 8 and a p-type contact layer 9. The semiconductor substrate 1 is a GaAs substrate slightly less than 100 μm in thickness. The n-type buffer layer 3 is formed of GaAs 0.5 μm thick, and the n-type clad layer (first clad layer) 4 of AlGaInP 2.0 μm thick. The active layer 5 has a barrier layer of AlGaInP 5 nm thick and a well layer of GaInP 6 nm thick, in which the well layer has a triple-layer multi-quantum well structure. The p-type clad layers include a lower p-type clad layer (first second clad layer) 6 and an upper p-type clad layer (second second clad layer) 8. The p-type etch stop layer 7 is formed between the p-type clad layer 6 and the p-type clad layer 8. The p-type clad layer (first second clad layer) 6 is an AlGaInP layer 0.3 μm thick, the p-type etch stop layer 7 a GaInP layer 5 nm thick and the p-type clad layer (second second clad layer) 8 an AlGaInP layer 1.2 μm thick. Also, the p-type contact layer 9 is formed as a GaAs layer 0.4 μm thick.

The first surface of the semiconductor substrate 2 formed with the multilayered semiconductor portion 13, as described above, forms a crystal face tilted by about θ with respect to the crystal face (001) of GaAs crystal. The angle θ is 10°, and the first surface of the semiconductor substrate 2 is oriented in <001>.

The first surface of the semiconductor substrate 2 is formed with two isolation grooves 11a, 11b extending from the upper surface of the p-type contact layer 9 to the lower surface of the p-type clad layer (second second clad layer) 8. The bottoms of the isolation grooves 11a, 11b are formed with an etch stop layer 7. The portion sandwiched between the two isolation grooves 11a, 11b forms a striped ridge (protrusion) 12. The ridge 12 is about 2 μm wide. The ridge 12 includes a portion formed of the striped p-type clad layer (second second clad layer) 8 having a square cross section and a portion formed of a rectangular ridge contact layer 9a of the square p-type contact layer 9 laid on the portion 8. By way of explanation, the portions expanding outside of the isolation grooves 11a, 11b are called a field.

The ridge 12 is formed with the two isolation grooves 11a, 11b formed by etching. According to the first embodiment, the p-type clad layer (second second clad layer) 8 is etched twice to form the isolation grooves 11a, 11b. The first etching is the dry etching process executed with the ridge contact layer 9a as a mask to roughly shape the isolation grooves 11a, 11b. In the dry etching, the corners of the etched bottom portion fail to be etched satisfactorily and remain as a portion to be removed. In order to etch off the remaining portion and set the cross section of the isolation grooves 11a, 11b in shape, the wet etching is carried out as a second etching process.

The p-type clad layer (second second clad layer) 8 is formed using the ridge contact layer 9a as a mask. Therefore, the width of the ridge portion of the p-type clad layer (second second clad layer) 8 is smaller than the width of the ridge contact layer 9a, and the side surfaces of the particular ridge portion is located inside of the two forward ends of the ridge contact layer 9a. In other words, the two forward ends of the ridge contact layer 9a are projected beyond the ridge portion of the p-type clad layer (second second clad layer) 8.

The ridge contact layer 9a is formed by wet etching using an etching mask formed on the upper surface of the p-type contact layer 9. In the process, due to the anisotropic etching, the upper surface portions on both sides of the ridge contact layer 9a form slopes 17a, 17b, respectively. The slopes 17a, 17b constitute the GaAs crystal plane (111). The slope 17a at the left end in FIG. 2 rises rightward, and the slope 17b at the right end declines rightward. As a result, the angle that the two slopes 17a, 17b form with the upper surface of the ridge contact layer 9a is an obtuse angle larger than 90°. This angle forming with the upper surface of the ridge contact layer 9a is about 130° on the left side and about 110° on the right side in FIG. 2.

On the first surface of the semiconductor substrate, an insulating film 20 covers the portion including and beyond the isolation grooves 11a, 11b and extending from the side surfaces 18, 19 of the ridge 12 facing the isolation grooves 11a, 11b to the side edge of the semiconductor substrate. Also, on the first surface side of the semiconductor substrate is formed a first barrier metal layer 27. The first barrier metal layer 27 covers the ridge 12 and the isolation grooves 11a, 11b.

Figure 4:
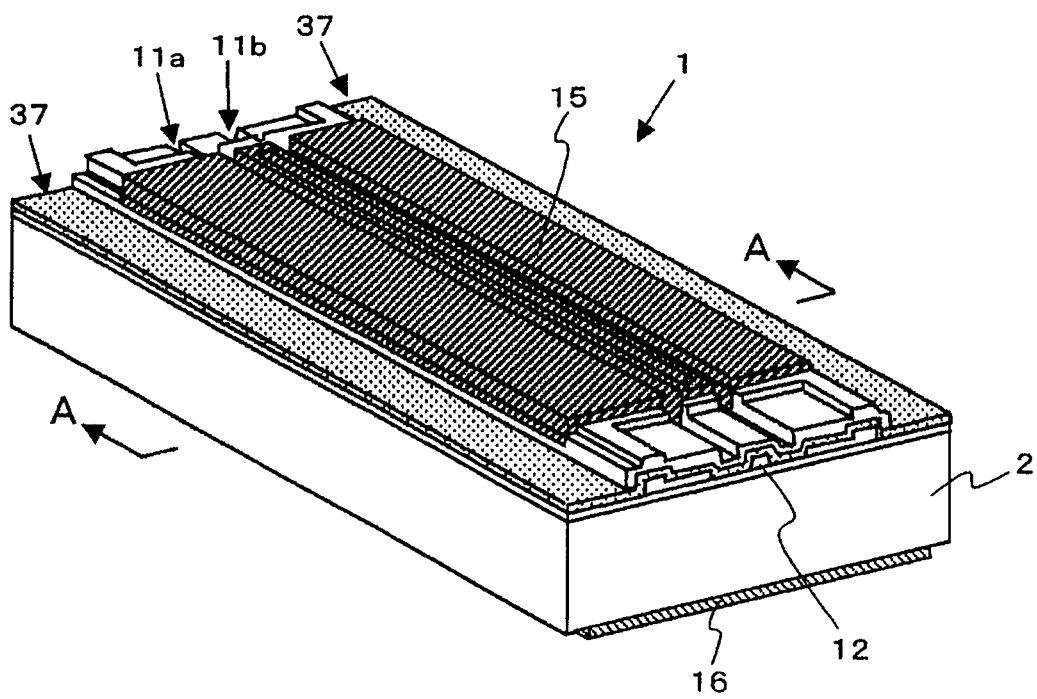
FIG. 4 is a perspective view of the semiconductor laser element shown in FIG. 3.

As shown in FIGS. 1 and 4, the upper surface portion of the ridge contact layer 9a includes an upper surface 17c, a slope 17a connecting to the left side of the upper surface 17c and a slope 17b connecting to the right side of the upper surface 17c. The upper surface 17c forms an obtuse angle with the slopes 17a, 17b, and therefore the first barrier metal layer 27 covering the upper surface portion of the ridge contact layer 9a is not disconnected at the corners connecting the upper surface 17c and the slopes 17a, 17b to each other.

Also, as understood from the fabrication method described later, the two forward end portions of the ridge contact layer 9a are formed on the insulating film 20 covering the side surface of the p-type clad layer (second second clad layer) 8 forming the ridge 12. The first barrier metal layer 27 covering the ridge contact layer 9a is closely attached on the insulating film 20 having such a structure as to support the ridge contact layer 9a, so that the first barrier metal layer 27 and the insulating film 20 are connected to each other without interruption. The first barrier metal layer 27 and the insulating layer 20, therefore, have such a structure as to wrap and cover the ridge 12 including the ridge contact layer 9a, where no disconnection in the first barrier metal layer 27 takes place any longer.

On the other hand, an Au plating layer 28 is formed in superposed relation with the first barrier metal layer 27. A second barrier metal layer 33 is formed on the Au plating layer 28, and an Au layer 34 is formed on the second barrier metal layer 33. A first electrode (positive electrode) 15 is formed of the first barrier metal layer 27, the Au plating layer 28, the second barrier metal layer 33 and the Au layer 34. The second barrier metal layer 33 is formed of a conductive layer of selectively one of Ni, Pt, Pd and Mo. According to the first embodiment, the second barrier metal layer 33 is formed of Ni. Also, the first electrode 15 may include more layers. Though not shown in FIG. 2, the second surface of the semiconductor substrate 2 far from the first surface thereof is formed with a second electrode (negative electrode) 16.

In this semiconductor laser element 1, the first electrode 15 and the second electrode 16 are impressed with a predetermined voltage to emit the laser light from the two facets of the semiconductor laser element 1 perpendicular to the direction in which the ridge 12 extend. The striped active layer portion facing the ridge 12 makes up an optical waveguide (resonator) with a current supplied thereto, and the two ends of the optical waveguide form the emitting facets of the laser light.

Figure 3:
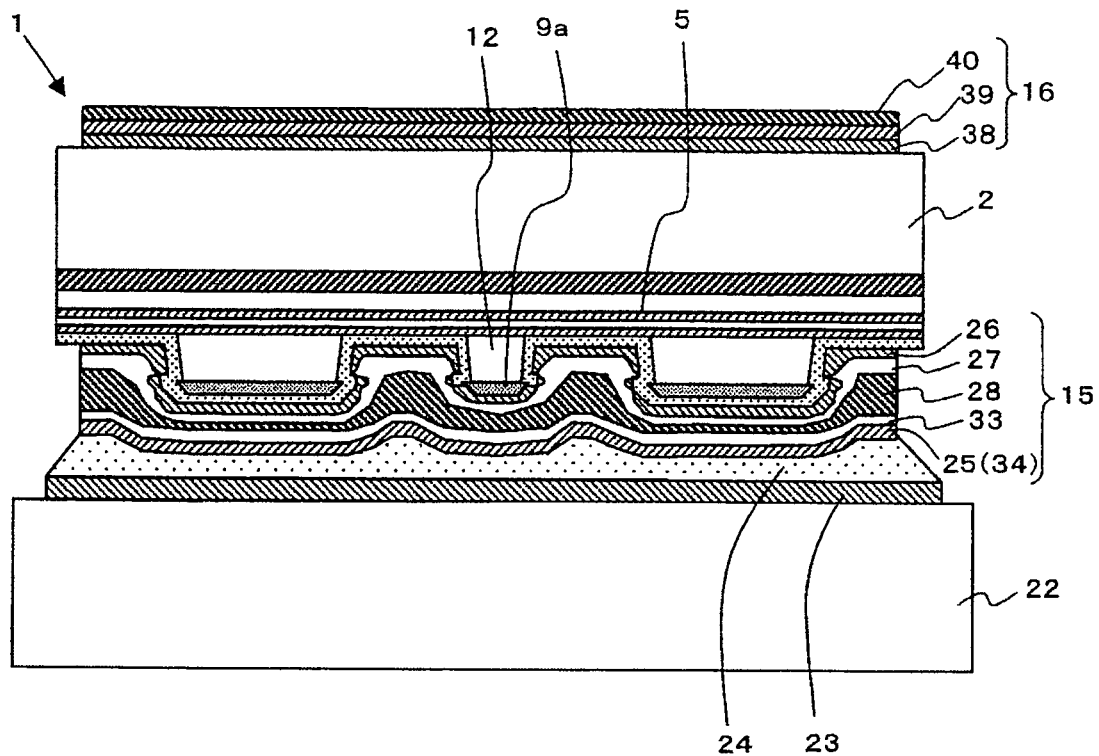
FIG. 3 is a partial sectional view of the opto-semiconductor device according to the first embodiment.
Figure 5:
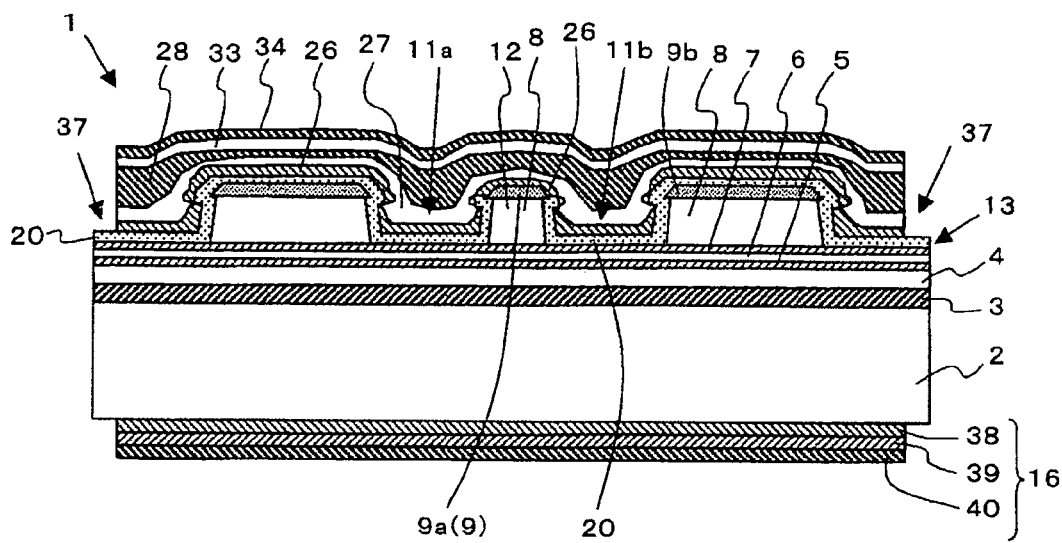
FIG. 5 is an enlarged sectional view taken in line A-A in FIG. 4.
Figure 6:
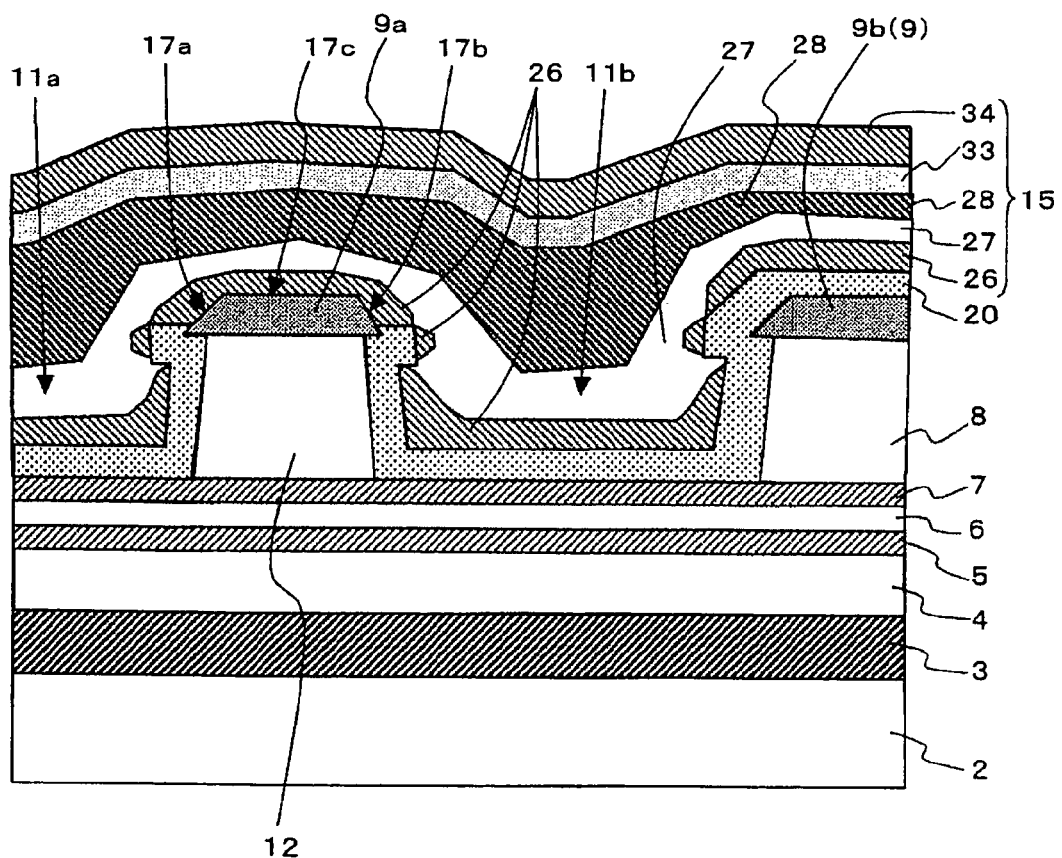
FIG. 6 is a partly enlarged sectional view of FIG. 5.

FIG. 4 is a perspective view showing the semiconductor laser element 1 actually fabricated. FIG. 5 is a sectional view taken in line A-A in FIG. 4. FIG. 6 is an enlarged sectional view showing the ridge 12 of FIG. 5 more clearly. FIG. 3 is an enlarged sectional view of the semiconductor laser chip 1 fixed junction-down on the support substrate 22.

As shown in FIGS. 4 and 5, in the actual semiconductor laser element 1, grooves 37 are formed on both sides of the first surface of the semiconductor substrate 2 in the same manner as the isolation grooves 11a, 11b. FIGS. 3 to 6 more specifically show the first electrode 15 formed on the first surface and the second electrode 16 formed on the second surface of the semiconductor substrate 2. Specifically, the first electrode 15 is a multilayered structure including, sequentially stacked, a Ti layer 26 having the thickness of 0.05 μm, a Pt layer making up the first barrier metal layer 27 having the thickness of 0.1 μm, an Au plating layer 28 having the thickness of 3 μm, a Ni layer making up the second barrier metal layer 33 having the thickness of 0.2 μm and an Au layer 34 having the thickness of 0.25 μm. As shown in FIG. 3, the semiconductor laser chip 1 is fixed junction down on the AlN support substrate 22 having the coefficient of thermal expansion of 4.6 to 4.7×10$^{-6}$/° K by the bonding material 24 of AuSn. Then, by virtue of the effect of the reaction stopping function of the second barrier metal layer 33, only the uppermost Au layer 34 constituting the first electrode 15 is changed to the reaction layer 25. As a result, the reaction layer 25 is uniform in thickness for smaller variations of the direction of polarization of the laser light.

The second electrode 16 formed on the second surface of the semiconductor substrate 2 of the semiconductor laser chip 1 has a multilayer structure in which an AuGeNi layer 38 having the thickness of 0.2 μm, a Cr layer 39 having the thickness of 0.2 μm and an Au layer 40 having the thickness of 1.0 μm are stacked sequentially.

As shown in FIG. 6, the Ti layer 26, together with the insulating film 20, completely covers the ridge contact layer 9a. Also, the first barrier metal layer 27 of Pt is in such a superior state as to continuously cover the whole surface of the ridge 12 without interruption at step portion. As a result, the Au plating layer 28 and the ridge contact layer 9a are kept out of contact, so that the characteristics of the semiconductor laser element 1 are not deteriorated by the diffusion of Au into the ridge contact layer 9a.

The semiconductor laser element 1 shown in FIGS. 4 and 5 may be so structured that a groove 37 along the isolation grooves 11a, 11b extends along each side edge of the first surface of the semiconductor substrate 2 from one end (lower right end surface in FIG. 4) to the other end (upper left end surface in FIG. 4) of the semiconductor substrate 2. In this structure, as shown in FIG. 5, the grooves 37 are formed to such a depth (the middle layer of the second clad layer) as to expose the p-type etch stop layer 7. The grooves 37 are also covered by the insulating layer 20 and the first barrier metal layer 27. In this structure, the first electrode (positive electrode) 22 can be formed narrower than the semiconductor laser element 1.

The n-type buffer layer 3 included in the first embodiment may be done without. Also, as an alternative to the structure in which the p-type clad layer (first second clad layer) 6, the p-type etch stop layer 7 and the p-type clad layer (second second clad layer) 8 are formed between the active layer 5 and the p-type contact layer 9 with the p-type etch stop layer 7 exposed to the bottom of the isolation grooves 11a, 11b, a structure can be employed with equal effect in which a p-type second clad layer is formed between the active layer 5 and the p-type contact layer 9 with the isolation grooves 11a, 11b extended to the middle layer portion of the p-type second clad layer.

Figure 7:
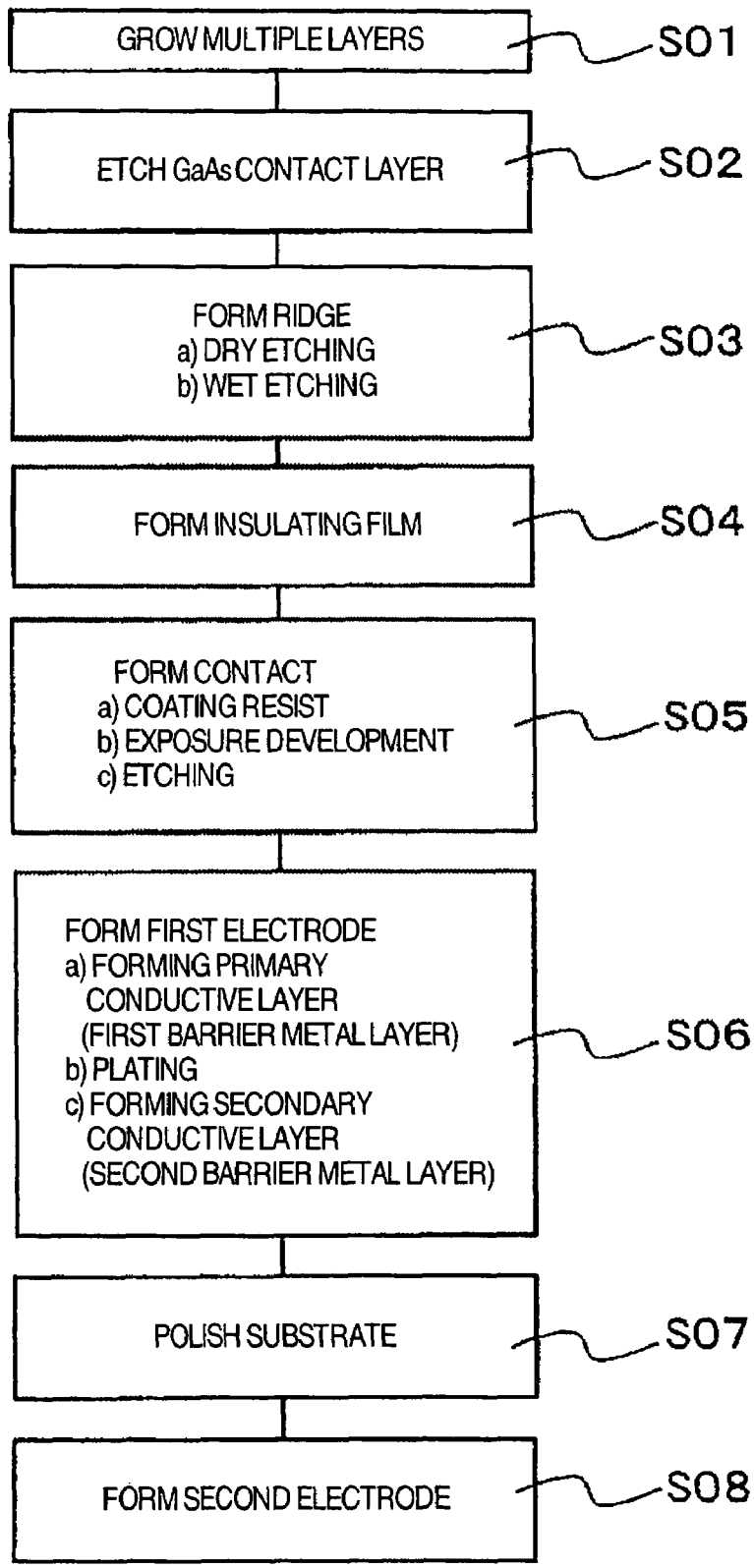
FIG. 7 is a flowchart showing the fabrication process of the semiconductor laser element.

Next, a method of fabricating the semiconductor laser element 1 having the structure shown in FIG. 2 is explained with reference to FIGS. 7 to 10. The semiconductor laser element 1 according to the first embodiment, as shown in the flowchart of FIG. 7, is fabricated by the steps of growing a multiplicity of layers (S01), etching the GaAs contact layer (S02), forming the ridge (S03), forming the insulating film (S04), forming the contact (S05), forming the first electrode (S06), polishing the substrate (S07) and forming the second electrode (S08). The step of forming the contact includes the substep (a) of coating a resist, the substep (b) of exposure and development and the substep (c) of etching. The step of forming the first electrode, on the other hand, includes the substep (a) of forming the primary conductive layer (the first barrier metal layer), the substep (b) of plating and the substep (c) of forming the secondary conductive layer (the second barrier metal layer).

FIGS. 8A to 8E are schematic diagrams showing the process executed on the semiconductor substrate, etc. including the steps of growing a multiplicity of layers, forming the ridge CVD, etching the GaAs contact layer, forming the ridge (dry etching) and forming the ridge (wet etching). FIGS. 9A to 9E, on the other hand, are schematic diagrams showing the process executed on the semiconductor substrate, etc. including the steps of forming the insulating film, coating a contact resist, exposure and development for contact, forming the contact (CVD film, dry etch) and forming the primary conductive layer. FIGS. 10A to 10D are schematic diagrams showing the process executed on the semiconductor substrate, etc. including the steps of plating Au, forming the secondary conductive layer, polishing the substrate and forming the second electrode. The steps shown in FIGS. 8 and 10 are a further detailed representation of the steps shown in the flowchart of FIG. 7.

First, a semiconductor substrate 2 of a first conduction type (n type) formed of GaAs having a first surface and a second surface on the opposite surface far from the first surface is prepared. In this semiconductor substrate 2, the first surface for forming multiple growth layers makes up a crystal plane tilted by about θ (10°) with respect to the crystal plane (001) of the GaAs crystal. The first surface of the semiconductor substrate 2 is oriented in the direction <001>.

Figure 8A:
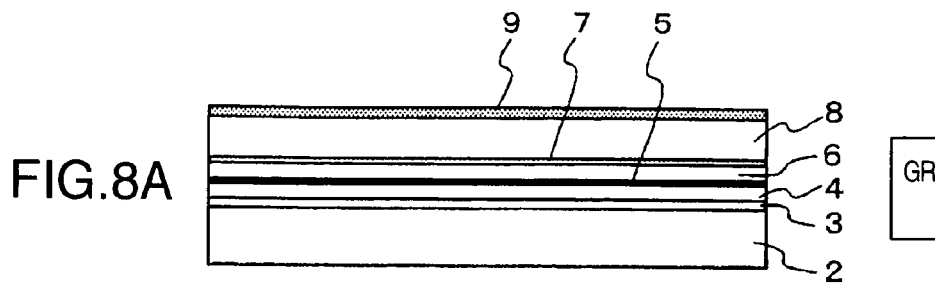
FIGS. 8A to 8E are sectional views schematically showing the semiconductor substrate in the process from the multiple layer growth step to the ridge forming step (wet etching) in the fabrication method of the semiconductor laser element.

In the multilayer growth step shown in FIG. 8A, the first surface of the semiconductor substrate 2 of n-type GaAs is formed, by MOCVD (Metal Organic Chemical Vapor Deposition) to a predetermined thickness at a time, with a n-type buffer layer 3, a n-type clad layer (first clad layer) 4, an active layer 5, a p-type clad layer (first second clad layer) 6, a p-type etch stop layer 7, a p-type clad layer (second second clad layer) 8 and a contact layer 9. As an example, the n-type buffer layer 3 is formed to the thickness of 0.5 μm, the n-type clad layer 4 to the thickness of 2.0 μm, the active layer 5 to the thickness of 0.04 μm, the p-type clad layer (first second clad layer) 6 to the thickness of 0.3 μm, the p-type etch stop layer 7 to the thickness of 5 nm, the p-type clad layer (second second clad layer) 8 to the thickness of 1.2 μm and the p-type contact layer 9 to the thickness of 0.4 μm.

Figure 8B:
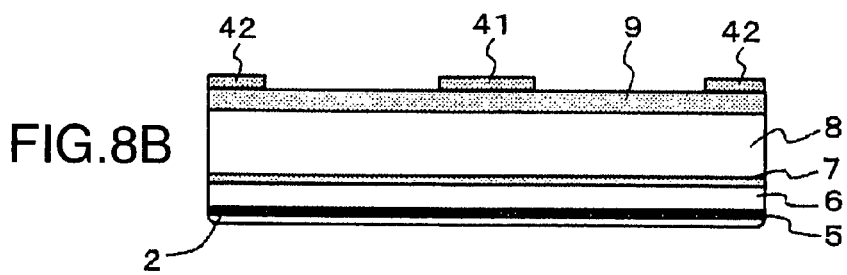

Next, the ridge forming CVD step shown in FIG. 8B, a SiO$_2$ film 400 nm thick, for example, is formed on the upper surface of the p-type contact layer 9 by the CVD process. After that, the SiO$_2$ film is patterned by the photolithography and etching techniques well known thereby to form a striped ridge forming etching mask 41 for the ridge 12 and a field etching mask 42 at a predetermined distance from the ridge forming etching mask 41.

Figure 8C:
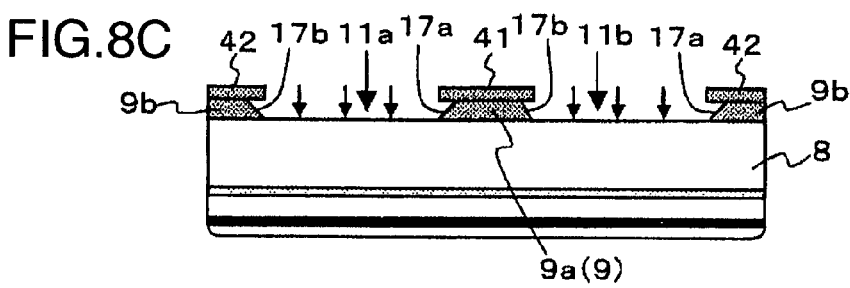

In the next step shown in FIG. 8C to etch the GaAs contact layer, the portion of the contact layer 9 where the isolation grooves 11a, 11b are to be formed is removed by the anisotropic wet etching using the ridge forming etching mask 41 and the field etching mask 42. As a result of this etching step, a ridge contact layer 9a is formed under the ridge forming etching mask 41 and a field contact layer 9b under the field etching mask 42.

As an etching solution, POG (etching solution composed of phosphoric acid, hydrogen peroxide water and ethylene glycol) having the anisotropic etching characteristic for GaAs crystal is used. The first surface of the semiconductor substrate 2 constitutes a crystal plane tilted by about θ with respect to the crystal plane (001) of the GaAs crystal. As a result, the p-type contact layer 9 of the GaAs layer has the same crystallinity. The two sides of the p-type contact layer 9 are formed into the slopes 17a, 17b, respectively, by the etching solution intruding under the ridge forming etching mask 41 by anisotropic etching. The slopes 17a, 17b make up the GaAs crystal plane (111). The slope 17a at the left end in FIG. 8C rises rightward, and the slope 17b at the right end declines rightward. As a result, the angle that the two slopes 17a, 17b form with the upper surface of the ridge contact layer 9a is an obtuse angle larger than 90°. The angle that the two slopes 17a, 17b form with the upper surface of the ridge contact layer 9a is about 130° on the left side and about 110° on the right side in FIG. 1. These slopes also appear at the etching ends of the field contact layer 9b under the field etching mask 42. The arrows in FIG. 1 show the etching directions.

Figure 8D:
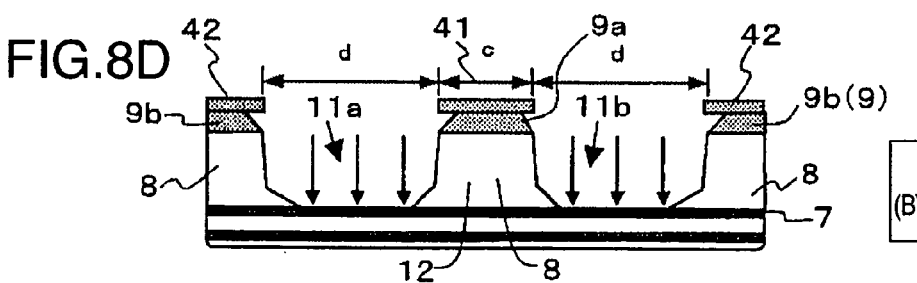

Next, in the step of forming the ridge by dry etching shown in FIG. 8D, the isolation grooves 11a, 11b are further deepened by etching the p-type clad layer (second second clad layer) 8 using each ridge contact layer 9a and each field contact layer 9b as a mask to such an extent that the p-type etch stop layer 7 is exposed to the bottom surface of the isolation grooves 11a, 11b. The isolation grooves 11a, 11b divide the sets of the p-type clad layer (second second clad layer) 8 and the p-type contact layer 9 from each other. The portions each sandwiched by the two isolation grooves 11a, 11b form striped ridges 12 each having a width a of, say, 2 µm. The width d of the isolation grooves 11a, 11b is 10 µm. The width c of the ridge forming etching mask 41 is also 2 µm.

Figure 8E:
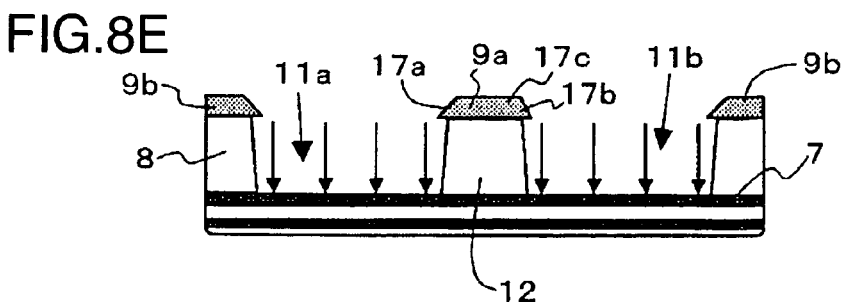

In the dry etching process in which the bottom corners of the isolation grooves 11a, 11b are not sufficiently etched, as shown in FIG. 8E, the ridge 12 having a square cross section is formed by wet etching using the HF or HCl etching solution. The wet etching is carried out after removing the ridge forming etching mask 41 and the field etching mask 42. By the two etching processes, each forward end of the p-type contact layer 9 etched is projected (overhung) from the ridge 12.

Next, as shown in FIG. 9A, an insulating film 20 is formed by CVD process in such a manner as to cover the ridge 12 and the isolation grooves 11a, 11b. The insulating film 20 is formed of a SiO$_2$ film 200 nm thick, for example. The SiO$_2$ film can positively cover the vertical structure and the overhung portion.

As shown in FIG. 9B, in order to form a contact hole for connecting the electrode and the ridge contact layer 9a making up the upper portion of the ridge 12, a contact resist 43 is coated over the ridge 12 and the isolation grooves 11a, 11b.

As shown in FIG. 9C, a photomask 45 having an opening 44 with the ridge portion 12 located therein is formed by the well-known photolithography and the etching technique on the insulating film 20. The contact resist 43 is exposed and developed using the photomask 45. As a result, the contact resist 43 portion on the ridge 12 is removed and the insulating film 20 on the ridge contact layer 9a is exposed. Also, the portion of the insulating film 20 covering the two sides of the ridge contact layer 9a is exposed by setting the width m of the opening 44 of the photomask 44 to about 12 µm. To facilitate the understanding, the photomask 45 is shown afloat in FIG. 9C, though actually closely in contact with the contact resist 43.

After removing the photomask 45, the insulating film 20 exposed on the ridge 12 is removed by dry etching as a step to form a contact hole. Thus, the ridge contact layer 9a is exposed (FIG. 9D).

Next, as shown in FIG. 9E, the primary conductive layer including the first barrier metal layer 27 is formed by vapor deposition. The first barrier metal layer 27 of Pt is formed by vapor deposition in such a manner as to cover the ridge 12 and the isolation grooves 11a, 11b. This is to prevent the deterioration of the characteristics of the semiconductor laser by the diffusion of Au into the contact layer 9a, which otherwise might be caused by the fact that Au forms a part of the conductive layer of the first electrode 15. As an example, the vapor deposition is carried out by evaporating Ti, Pt and Au in that order. The Pt and Ti layers act as a barrier to keep the ridge contact layer 9a out of contact with Au. Subsequently, in preparation for subsequent Au layer plating, a thin Au layer is formed on the uppermost layer. The Ti layer is 0.05 µm thick, the Pt layer 0.1 µm thick and the Au layer 0.3 µm thick. The uppermost Au layer is integrated with Au formed by Au plating performed in a subsequent step. The Au plating layer is shown in FIG. 9E. The metals and combinations thereof used as a barrier are not limited to those shown in the embodiments.

In forming the barrier metal, the two side surfaces of the ridge 12 are covered by the insulating film 20, and the two side surfaces of the ridge contact layer 9a forming the upper portion of the ridge 12 constitute the slopes 17a, 17b, respectively. The upper surface 17c of the ridge contact layer 9a forms an obtuse angle with the slopes 17a, 17b, and therefore is positively covered by the first barrier metal layer 27.

In the ridge forming process, the ridge contact layer 9a and the field contact layer 9b are formed by etching the p-type contact layer 9, after which the two sides of the ridge contact layer 9a are formed into the slopes 17a, 17b, respectively. Then, using the ridge contact layer 9a and the field contact layer 9b as a mask, the isolation grooves 11a, 11b are formed by two etching sessions of dry and wet etching. As a result, the two forward end portions of the ridge contact layer 9a constituting the slopes 17a, 17b are projected into the isolation grooves 11a, 11b. At least the lower surfaces of the forward end portions thus projected are covered by the insulating film 20. Also, the insulating film 20 covering each of the side surfaces of the p-type clad layer (second second clad layer) 8 forming the ridge portion under the ridge contact layer 9a is projected toward the isolation grooves beyond the two projections of the ridge contact layer 9a. As a result, the first barrier metal layer 27 covering the ridge contact layer 9a is superposed on the insulating film 20 projected from the two sides of the ridge contact layer 9a. Thus, the first barrier metal layer 27 facing the ridge contact layer 9a is connected to the insulating film 20 and covers the ridge contact layer 9a. Therefore, the ridge contact layer 9a is kept out of contact with the Au plating layer and Au is prevented from being diffused into the ridge contact layer 9a.

Figure 10A:
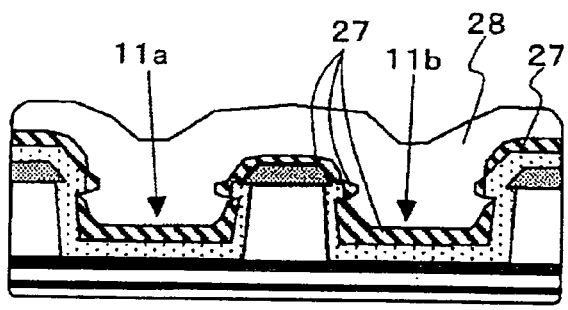
FIGS. 10A to 10D are sectional views schematically showing the semiconductor substrate in the process from the Au plating step to the step of forming a second electrode in the fabrication method of the semiconductor laser element.

Next, as shown in FIG. 10A, Au is plated to form an Au plating layer 28 on the first barrier metal layer 27. The Au plating layer 28 is 2.7 µm thick, for example, and forms an Au layer 3 µm thick integrated with the aforementioned Au layer 0.3 µm thick formed by vapor deposition.

Figure 10B:
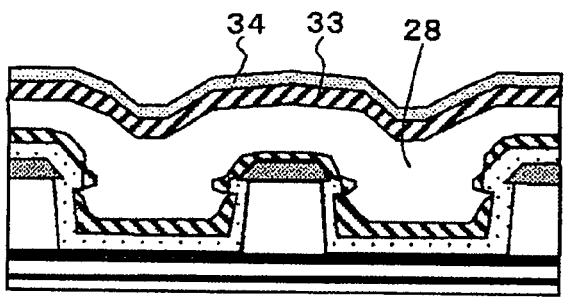

Next, as shown in FIG. 10B, the secondary conductive layer is formed by vapor deposition. Thus, a Ni layer 0.2 µm thick is formed as a second barrier layer 333 on the Au plating layer 28, and an Au layer 34 having the thickness of 0.25 µm is formed on the second barrier metal layer 333. As a result, the first electrode 15 is formed. In FIG. 6, the first electrode 15 is formed of a stack of the Ti layer 26, the first barrier metal layer 27 of Pt, the Au plating layer 28, the second barrier metal layer 33 of Ni and the Au layer 34.

Figure 10C:
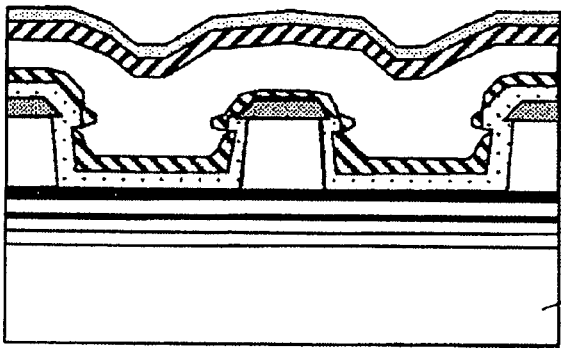

Then, as shown in FIG. 10C, the second surface of the semiconductor substrate 2 is polished to a predetermined thickness thereby to form the semiconductor substrate 2 to a predetermined thickness.

Figure 10D:
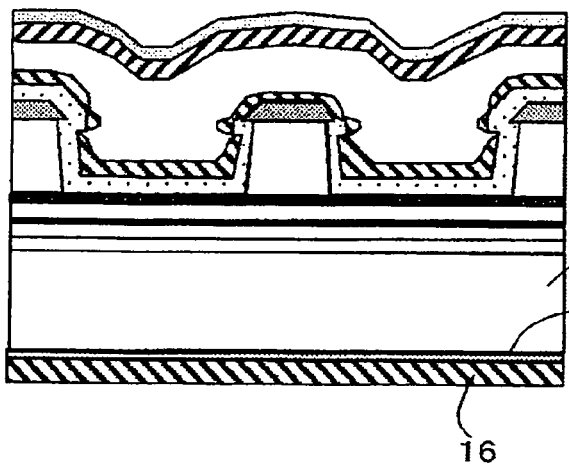

As shown in FIG. 10D, the second electrode 16 has a backing electrode 47. An AuGeNi layer 38, a Cr layer 39 and an Au layer 40 (FIG. 5), for example, are sequentially deposited by evaporation thereby to form the second electrode 16. The Au plating layer is formed to the thickness of, say, 3.5 µm. FIG. 5 shows this triple-layer structure.

In this way, the semiconductor laser element 1 is fabricated. In the actual fabrication process, a semiconductor substrate called a wafer large in area is used, and a plurality of semiconductor substrates having the cross section shown in FIG. 10D are formed in parallel. After that, the wafer is segmented parallel to the ridge 12 at predetermined intervals to form a striped structure. Further, this striped structure is cleaved at predetermined intervals thereby to fabricate a plurality of semiconductor chips.

Figure 11:
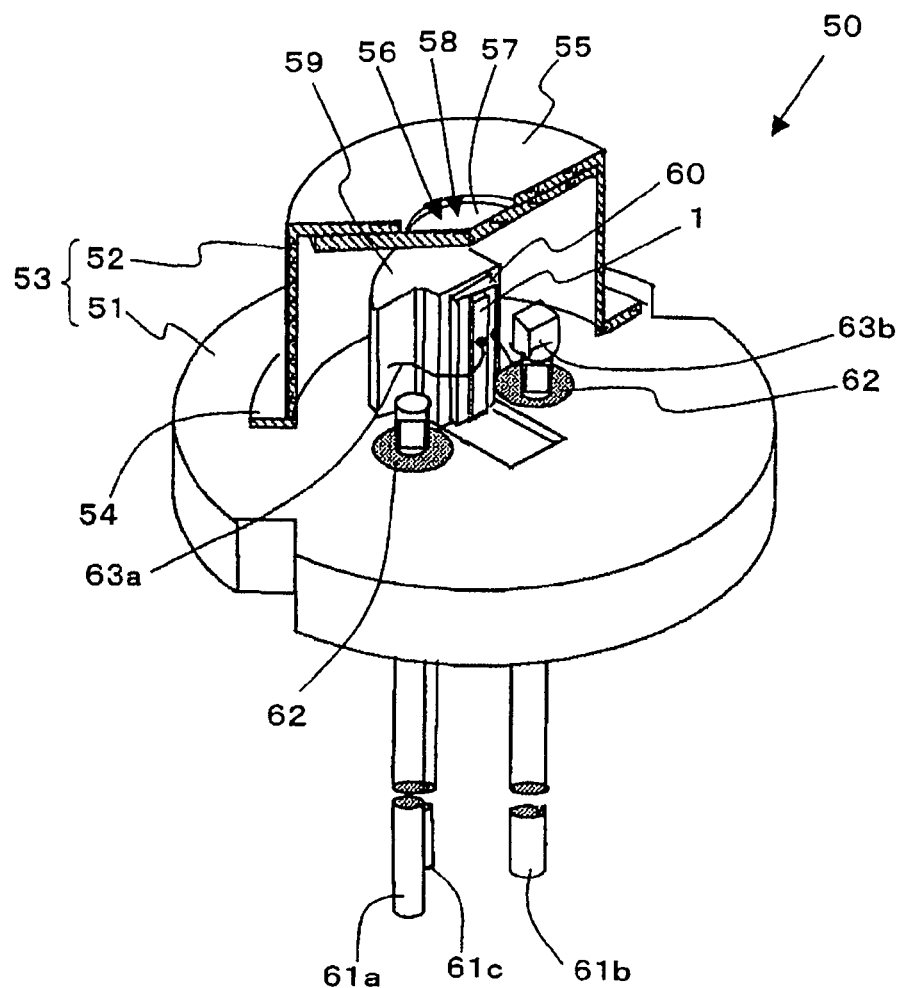
FIG. 11 is a partly cutaway perspective view showing the opto-semiconductor device according to the first embodiment.

This semiconductor laser element (opto-semiconductor element) 1 thus fabricated is used as a semiconductor laser device (opto-semiconductor device) built in a package (sealing case). FIG. 11 shows an example of the opto-semiconductor device (semiconductor laser device) 50 having the semiconductor laser element 1 built therein.

The semiconductor laser device 50 includes a stem 51 several mm thick formed of a metal plate (disk) having a first surface and a second surface opposite to the first surface and a cap 52 fixed in such a manner as to cover the first surface (upper surface in FIG. 10) of the stem 51. The stem 51 and the cap 52 make up the package 53.

A flange 54 is formed in the lower part of the cap 52, and the lower surface of the flange 54 is connected to the stem 51 by a bonding material not shown. A hole 56 is formed in the ceiling 55 of the cap 52, and closed by a transparent glass plate 57 to form a window 58. The laser light is radiated out of the package 53 from the window 58. The ceiling 55 is in opposed relation to the first surface of the stem 51.

Figure 12:
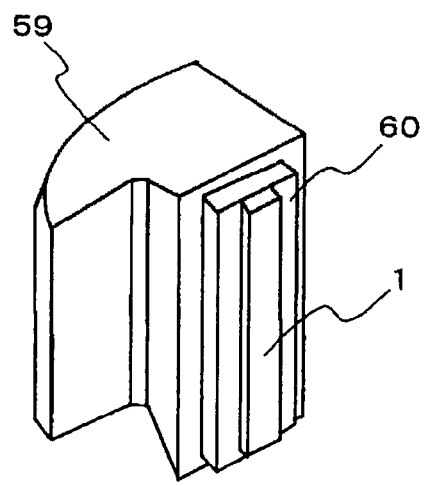
FIG. 12 is a perspective view of a heat sink making up a constituent part of the opto-semiconductor device and the semiconductor laser element fixed on the heat sink through a submount.

A heat sink 59 of copper is fixed by a brazing material or the like on a portion off the center of the first surface of the stem 51. A submount 60 of AlN (aluminum nitride) having a high heat conductivity is fixed at the forward end on the side surface of the heat sink 59 facing the center of the stem 51 (FIG. 12). The submount 60 is formed of a rectangular plate larger than the semiconductor laser element 1. The semiconductor laser element 1 is elongate and the laser light is emitted from the two ends thereof. Therefore, the elongate submount 60 is fixed on the heat sink 59 in the direction perpendicular to the stem 51. As a result, the emitting surface of the semiconductor laser element 1 faces the window 58. Also, though not shown, the surface of the submount 60 is formed with a conductive layer including a chip fixing portion and a wire connecting pad extending from the chip fixing portion and having a wide forward end.

Three lead wires 61*a*, 61*b*, 61*c* are fixed on the stem 51. The two lead wires 61*a*, 61*b* are fixed through the stem 51 by way of the insulating members 62. The remaining lead wire 61*c* is fixed in opposed relation to the second surface far from the first surface of the stem 51 and kept electrically at equal potential with the stem 51.

The first electrode 15 of the semiconductor laser element 1 is fixed on the chip fixing portion, though not designated by a reference numeral, of the submount 60 through a conductive bonding material. The exposed second surface of the semiconductor laser element 1, therefore, constitutes the second electrode 16 (not designated by any reference numeral in FIGS. 11, 12). The second electrode 16 and the heat sink 59 are electrically connected to each other by a conductive wire 63*a*. As a result, the second electrode 16 of the semiconductor laser element 1 is electrically connected to the lead wire 61*c*. Also, the wide wire connecting pad extending from the chip fixing portion, not shown, formed on the surface of the submount 60 and the forward end projected toward the first surface of the step 51 of the lead wire 61*b* through the step 51 are electrically connected to each other by the conductive wire 63*b*. Thus, the first electrode 15 of the semiconductor laser element 1 is electrically connected to the lead wire 61*c*.

As described above, the heat sink 59, the lead wires 61*a*, 61*b*, the submount 60, the semiconductor laser element 1 and the wires 63*a*, 63*b* on the first surface of the stem 51 are covered by the cap 52.

Upon application of a predetermined voltage between the lead wires 61*b* and 61*c* of the semiconductor laser device 50, the laser light is emitted from the end surface of the semiconductor laser element 1 and radiated out of the stem 51 through the window 58.

Figure 13:
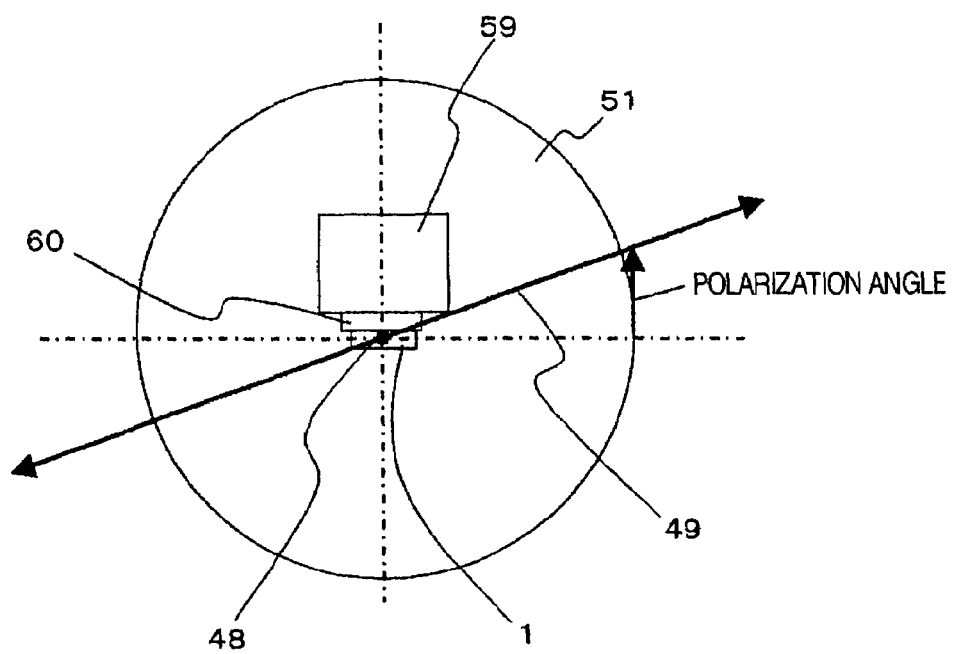
FIG. 13 is a schematic diagram for explaining the polarization angle.

FIG. 13 is a schematic diagram showing the semiconductor laser chip 1 as viewed from the first surface of the stem 51. The portion indicated by a black circle is the laser light 48 emitted from the facet (emitting facet) of the semiconductor laser chip 1. This laser light 48 is such that as described above, in the case where the semiconductor laser chip 1 is fixed on the support substrate 22 by the bonding material 24 of AuSn, the conductive layer (Au layer) on the surface of the first electrode 15 reacts with the AuSn solder. According to the first embodiment, the second barrier metal layer 33 not reacting with the AuSn solder is formed under the uppermost Au layer 34, and therefore only the uppermost Au layer 34 reacts with the AuSn solder to form a reaction layer 25. The Au layer 34 is formed by vapor deposition and therefore has a very small thickness variation in the same plane. Therefore, the thickness of the reaction layer 25 formed based on the Au layer 34 undergoes a very small variation.

As a result, the polarization angle of the laser light 48 is very small. In FIG. 13, the arrow with the arrowheads at both ends thereof indicates the polarization plane 49.

Figure 14A:
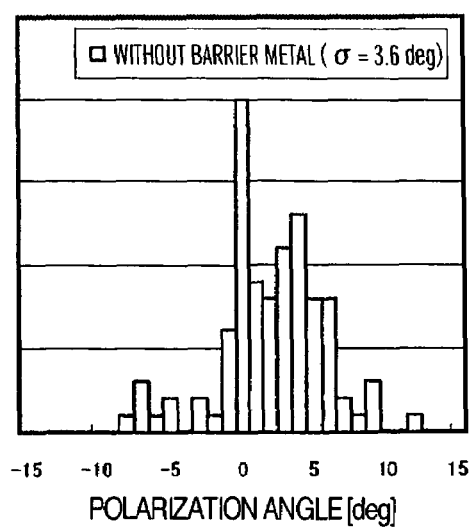
FIGS. 14A and 14B are graphs showing the fabrication variations of the polarization angle due to the presence or absence of a barrier metal layer (second barrier metal layer).
Figure 14B:
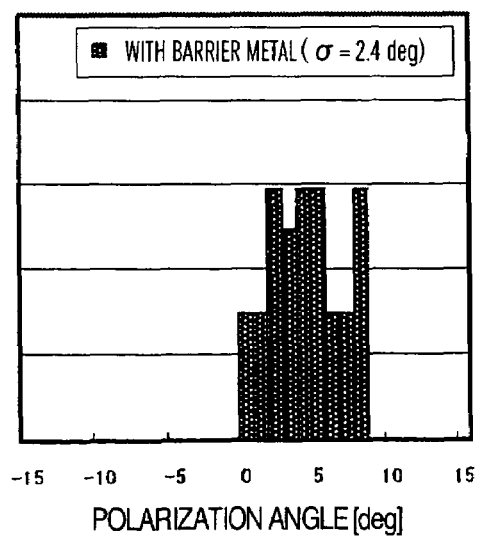

The graphs of FIGS. 14A, 14B show the variations in polarization angle in the fabrication process. FIG. 14A shows a case lacking the barrier metal layer and FIG. 14B a case with the barrier metal layer. The lack of the barrier metal layer leads to a great variation in polarization angle and a standard deviation of 3.59° for each element as shown in FIG. 14A. According to this embodiment having the barrier metal layer, in contrast, as shown in FIG. 14B, the variation of the polarization angle is small with the standard deviation of 2.43° for each element.

This first embodiment has the following advantages:

(1) In the semiconductor laser element 1 built in the opto-semiconductor device (semiconductor laser device) 50, the second barrier metal layer 33 of Ni not reactive with the AuSn solder is formed under the uppermost Au layer 34 of the first electrode 15. Also, the Au layer 34, which is formed by vapor deposition, has a uniform thickness distribution with a small thickness variation. In the case where the first electrode 15 of the semiconductor laser chip 1 is bonded to the support substrate 22 by AuSn solder, therefore, the second barrier metal layer 33 fails to react with the AuSn solder, but only the uppermost Au layer 34 making up the first electrode 15 reacts with the AuSn solder to form the reaction layer 25. In view of the small thickness variation of the Au layer 34, the thickness variation of the reaction layer 25 formed based on the Au layer 34 is also small. As a result, a smaller stress is exerted on the multilayered semiconductor portion 13 in the surface layer of the semiconductor laser element 1 due to the otherwise uneven thickness of the reaction layer 25, so that no uneven, large stress is exerted on the resonator (optical waveguide) 14 formed in the multilayered semiconductor portion 13. Thus, the variation of the polarization angle of the laser light is reduced in the opto-semiconductor device 50 for an improved polarization characteristic.

(2) In forming the ridge of the semiconductor laser chip 1 built in the opto-semiconductor device (semiconductor laser device) 50 according to the first embodiment, the p-type contact layer 9 is etched to form the ridge contact layer 9*a* and the field contact layer 9*b*, after which the slopes 17*a*, 17*b* are formed on the two sides, respectively, of the ridge contact layer 9*a*. Then, using the ridge contact layer 9*a* and the field contact layer 9*b* as a mask, the isolation grooves 11*a*, 11*b* are formed by two etching sessions including dry and wet etching. As a result, the forward end portions making up the slopes 17a, 17b on both sides of the ridge contact layer 9a are projected into the isolation grooves, and at lease the lower surfaces of the forward ends so projected are covered by the insulating film 20. Also, the insulating film 20 covering the side surfaces of the p-type clad layer (second second clad layer) 8 making up the ridge forming portion under the ridge contact layer 9a is projected toward the isolation grooves beyond the two projections of the ridge contact layer 9a. Thus, the first barrier metal layer 27 covering the ridge contact layer 9a is superposed on the insulating films 20 projected from the two sides of the ridge contact layer 9a. Therefore, the insulating film 20 and the first barrier metal layer 27 facing the ridge contact layer 9a are connected to each other in such a manner as to wrap or surround and cover the ridge contact layer 9a. This keeps the ridge contact layer 9a out of contact with the first electrode (positive electrode) 22 of Au, thereby preventing Au from being diffused into the ridge contact layer 9a. The opto-semiconductor device having this semiconductor laser element 1 built therein is improved in reliability.

Second Embodiment

Figure 15:
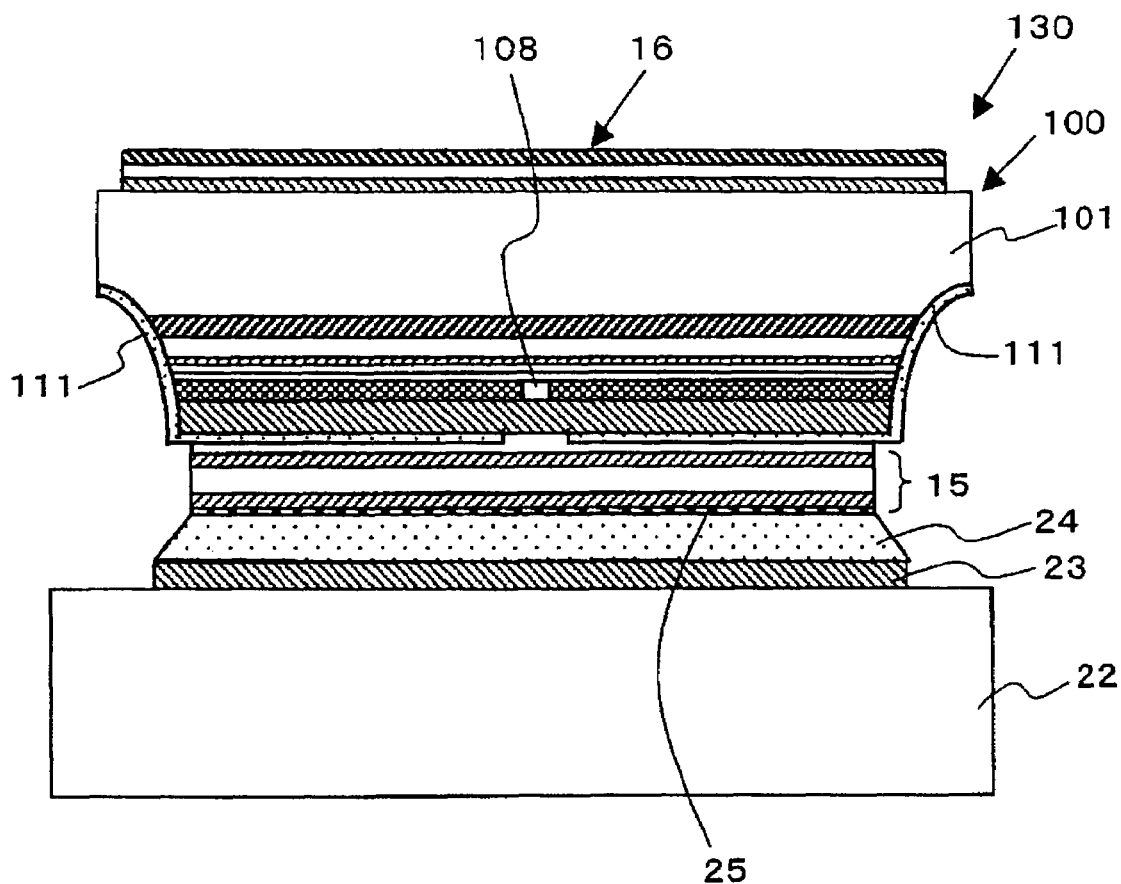
FIG. 15 is a schematic diagram showing a part of the opto-semiconductor device according to a second embodiment of the invention.
Figure 16:
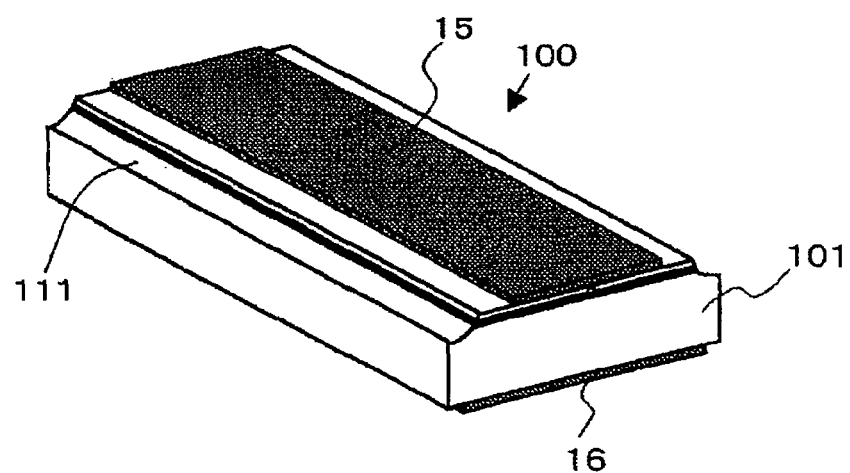
FIG. 16 is a perspective view of a semiconductor laser element built in the opto-semiconductor device according to the second embodiment.
Figure 17:
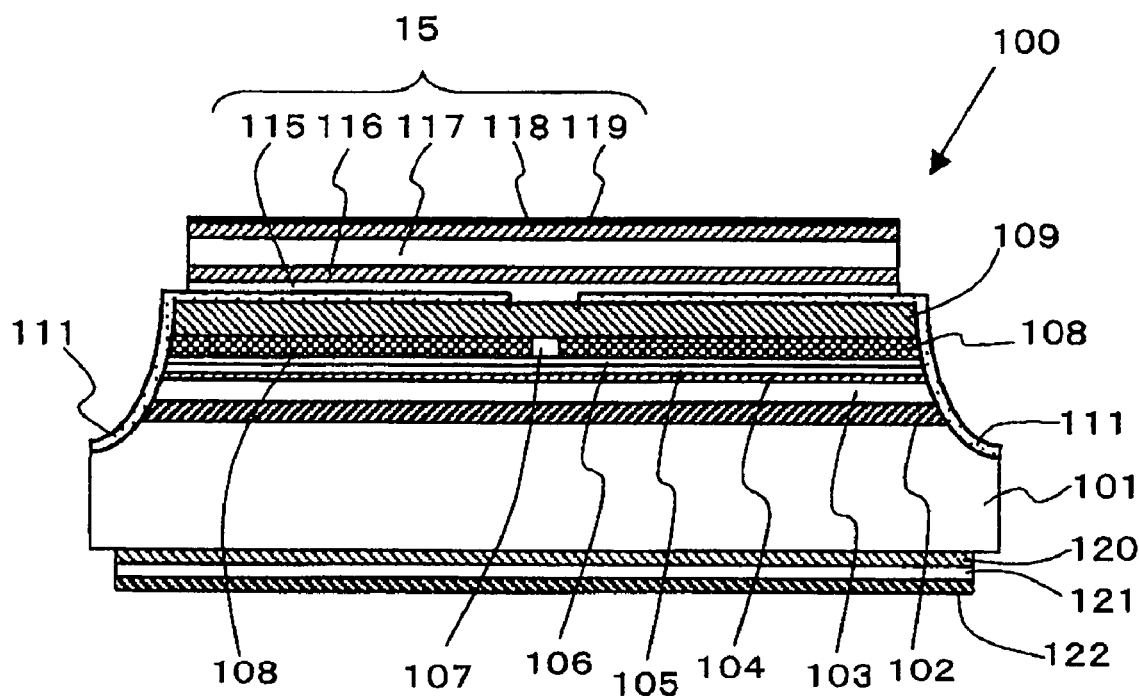
FIG. 17 is a sectional view of the semiconductor laser element shown in FIG. 16.

FIGS. 15 to 17 are diagrams showing an opto-semiconductor device according to a second embodiment of the invention. FIG. 15 is a schematic diagram showing a part of the opto-semiconductor device, FIG. 16 a perspective view of the semiconductor laser element built in the opto-semiconductor device, and FIG. 17 a sectional view of the semiconductor laser element cut away along the plane perpendicular to the resonator.

In the semiconductor laser element 100 according to this embodiment, a n-type buffer layer 102 of GaAs, a n-type clad layer (first clad layer) 103 of AlGaInP, an active layer 104 of a multi-quantum well structure having a barrier layer of AlGaInP and a well layer of GaInP, a p-type clad layer (first second clad layer) 105 of AlGaInP and a p-type etch stop layer 106 of AlGaInP are stacked on the first surface of a n-type GaAs substrate (semiconductor substrate) 101. A p-type clad layer (third second clad layer) 107 of AlGaInP is formed in stripe on the central part of the p-type etch stop layer 106, and a p-type clad layer (second second clad layer) 108 of AlGaInP is formed on the etch stop layer 106 on both sides of the third second clad layer 107. Also, a p-type contact layer 109 of GaAs is formed on the third second clad layer 107 and the second second clad layer 108.

These multiple semiconductor layers are mesa-etched to such an extent that the two sides thereof reach the semiconductor substrate 101, and the whole mesa portion is protected by the insulating film 111 of a SiO$_2$ film or the like. The insulating film 111 on the striped third second clad layer 107 is removed by a predetermined width. The opening left by the removed portion extends along the striped third second clad layer 107. The opening is formed along the length of the semiconductor laser element 100 shown in FIG. 16.

Also, the first electrode 15 is formed on the mesa of the semiconductor substrate 101, and the second electrode 16 on the second surface thereof. The first electrode 15 has a structure in which a Ti layer 115, a Pt layer 116, an Au layer 117, a Pt layer 118 constituting a barrier metal layer and an Au layer 119 are stacked in that order. The second electrode 16, on the other hand, is formed of an AuGeNi layer 120, a Cr layer 121 and an Au layer 122. The semiconductor laser element 100 is elongate as shown in FIG. 16. These layers are formed by vapor deposition and therefore each have a highly uniform thickness.

In this semiconductor laser element 100, a predetermined voltage is applied to the first electrode 15 and the second electrode 16 so that the laser light is emitted from the two ends of the active layer 104 corresponding to the third second clad layer 108.

FIG. 15 shows the semiconductor laser element 100 fixed on the support substrate 22 in the junction down configuration. The semiconductor laser chip 100 is bonded by the bonding material 24 of AuSn solder with the first electrode 15 in superposed relation with the chip fixing portion 23 of the support substrate 22. As the result of this bonding process, the Au layer 119 making up the uppermost conductive layer of the first electrode 15 changes to the reaction layer 25. The Pt layer 118 under the Au layer 119 acts as a barrier metal layer, and therefore, like in the first embodiment, the Pt layer 118 changes to the reaction layer 25. Also, due to the small thickness variation of the Pt layer 118, the reaction layer 25 also has a small thickness variation, resulting in an improved polarization characteristic of the opto-semiconductor device (semiconductor laser device) 130 according to the second embodiment.

The invention achieved by the present inventor is explained specifically above with reference to embodiments. This invention, however, is not limited to these embodiments, but can of course be variously modified without departing from the scope and spirit thereof. The embodiments described above represent an application of the invention to a semiconductor laser element in the band of 0.6 μm. Nevertheless, this invention is equally applicable to an opto-semiconductor device having built therein other semiconductor laser elements such as a long-wavelength (1.3 μm band or 1.5 μm band) semiconductor laser element for optical communication.

The invention claimed is:

1. An opto-semiconductor device comprising:
an opto-semiconductor element including
a semiconductor substrate,
a multilayered semiconductor portion formed on a. first surface of the semiconductor substrate and having a resonator for generating a laser in the inside layer of the multilayered semiconductor portion, the multilayered semiconductor portion over the resonator comprises a ridge sandwiched between isolation grooves,
an insulating layer covering a surface of the multilayered semiconductor and uncovering the top surface of the ridge,
a. first electrode having a multiplicity of conductive layers stacked on both the insulating layer and the top surface of the ridge, thereby the first electrode and the top surface of the ridge contact each other,
a second electrode formed on a second surface on the opposite side of the semiconductor substrate far from the first surface;
and a support substrate with a first surface thereof formed with an element fixing portion having a conductive layer for fixing the first electrode of the opto-semiconductor element,
wherein the first electrode of the opto-semiconductor element is connected to the element fixing portion of the support substrate through a bonding material, the first electrode comprises a first barrier layer, a second barrier layer, a first Au layer, and a second Au layer which are stacked on the multilayered semiconductor in this order, the bonding material and the second Au layer react with each other to form a reaction layer.

2. An opto-semiconductor device according to claim 1, wherein the second Au layer is thinner than the first Au layer.

3. An opto-semiconductor device according to claim 1, wherein the first Au layer is thinner than a depth of the grooves.

4. An opto-semiconductor device according to claim 1, wherein the first Au layer is thicker than a height of the ridge.

5. An opto-semiconductor device according to claim 1, wherein the first Au layer is a Au plating layer.

6. An opto-semiconductor device according to claim 1, wherein the bonding material is AuSn solder.

7. An opto-semiconductor device according to claim 1, wherein the insulating layer bonding material is AuSn solder.

8. An opto-semiconductor device according to claim 1, wherein both the first barrier layer and the second barrier layer metal are thinner than the first Au layer.

* * * * *